United States Patent [19]
Yamazaki et al.

[11] Patent Number: 5,961,743
[45] Date of Patent: *Oct. 5, 1999

[54] THIN-FILM PHOTOELECTRIC CONVERSION DEVICE AND A METHOD OF MANUFACTURING THE SAME

[75] Inventors: Shunpei Yamazaki, Tokyo; Yasuyuki Arai, Kanagawa, both of Japan

[73] Assignee: Semiconductor Energy Laboratory Co., Ltd., Kanagawa-ken, Japan

[*] Notice: This patent is subject to a terminal disclaimer.

[21] Appl. No.: 08/914,573

[22] Filed: Aug. 19, 1997

Related U.S. Application Data

[62] Division of application No. 08/623,336, Mar. 27, 1996, Pat. No. 5,700,333.

[30] Foreign Application Priority Data

Mar. 27, 1995 [JP] Japan ..................................... 7-129864
Mar. 27, 1995 [JP] Japan ..................................... 7-129865
Apr. 11, 1995 [JP] Japan ..................................... 7-110121

[51] Int. Cl.$^6$ .................................................. H01L 31/00
[52] U.S. Cl. ............................ 136/258; 136/261; 257/49; 257/75; 438/58; 438/476; 438/488; 438/491
[58] Field of Search ....................................... 136/258, 261; 257/49, 75; 438/58, 476, 488, 491

[56] References Cited

U.S. PATENT DOCUMENTS

| | | | |
|---|---|---|---|
| 5,244,819 | 9/1993 | Jue | 437/11 |
| 5,275,851 | 1/1994 | Fonash et al. | 427/578 |
| 5,403,772 | 4/1995 | Zhang et al. | 437/101 |
| 5,608,232 | 3/1997 | Yamazaki et al. | 257/66 |
| 5,700,333 | 12/1997 | Yamazaki et al. | 136/258 |

FOREIGN PATENT DOCUMENTS 5-109737  4/1993  Japan .

*Primary Examiner*—Mark Chapman
*Attorney, Agent, or Firm*—Fish & Richardson P.C.

[57] ABSTRACT

A method of manufacturing a thin-film solar cell, comprising the steps or: forming an amorphous silicon film on a substrate; holding a metal element that accelerates the crystallization of silicon in contact with the surface of the amorphous silicon film; subjecting the amorphous silicon film to a heat treatment to obtain a crystalline silicon film; depositing a silicon film to which phosphorus has been added in close contact with the crystalline silicon film; and subjecting the crystalline silicon film and the silicon film to which phosphorus has been added to a heat treatment.

62 Claims, 3 Drawing Sheets

THIN-FILM PHOTOELECTRIC CONVERSION DEVICE AND A METHOD OF MANUFACTURING THE SAME

This is a divisional of application Ser. No. 08/623,336, filed Mar. 27, 1996, now U.S. Pat. No. 5,700,333.

BACKGROUND OF THE INVENTION

1. Field of the Invention

The present invention relates to a thin-film photoelectric conversion device, especially a solar cell which is formed on a substrate. and more particularly to a thin-film solar cell having a photoelectric conversion layer formed of a crystalline silicon film.

2. Description of the Related Art

A solar cell or a solar battery can be manufactured using a variety of semiconductor materials or organic compound materials. However, from the industrial viewpoint, silicon which is of a semiconductor is mainly used for the solar cell. The solar cells using silicon can be classified into a bulk solar cell using a wafer of monocrystal silicon or polycrystal silicon and a thin-film solar cell having a silicon film formed on a substrate. The reduction of manufacture costs is required, and the thin-film solar cell is expected in the effect of reducing the costs because raw materials are less used for the thin-film solar cell than that for the bulk solar cell.

In the field of thin-film solar cell, an amorphous silicon solar cell has been put into practical use. However, since the amorphous silicon solar cell is lower in conversion efficiency compared with the monocrystal silicon or polycrystal silicon solar cell and also suffers from problems such as the deterioration due to light and so on the use thereof is limited. For that reason, as another means, a thin-film solar cell using a crystalline silicon film has been also developed.

A melt recrystallization method and a solid-phase growth method are used for obtaining a crystalline silicon film in the thin-film solar cell. Both the methods are that an amorphous silicon is formed on a substrate and recrystallized, thereby obtaining a crystalline silicon film. In any event, the substrate is required to withstand the crystallization temperature, whereby usable material is limited. In particular, in the melt recrystallization method, the substrate has been limited to a material that withstands 1,412° C., which is the melting point of silicon.

The solid-phase growth method is of a method in which an amorphous silicon film is formed on the substrate and crystallized thereafter through a heat treatment. In such a solid-phase growth method, in general, as the temperature becomes high, the processing time may be shortened more. However, the amorphous silicon film has been hardly crystallized at a temperature of 500° C. or lower. For example, when the amorphous silicon film which has been grown through a gas-phase growth method is heated at 600° C. so as to be crystallized, 10 hours are required. Also, when the heat treatment is conducted at the temperature of 550° C., a 100 hour or longer is required for the heat treatment.

For the above reason, a high heat resistance has been required for the substrate of the thin-film solar cell. Therefore, glass, carbon or ceramic was used for the substrate. However from the viewpoint of reducing the costs of the solar cell those substrates are not always proper and it has been desired that the solar cell is fabricated on a substrate which is most generally used and inexpensive. However for example the #7059 glass substrate made by Corning, which is generally used has a strain point of 593° C., and the conventional crystallization technique allows the substrate to be strained and largely deformed. For that reason, such a substrate could not be used. Also, since a substrate made of a material essentially different from silicon is used, monocrystal cannot be obtained even through crystallization is conducted on the amorphous silicon film through the above means, and silicon having large crystal grains is hard to obtain. Consequently, this causes a limit to an improvement in the efficiency of the solar cell.

In order to solve the above problems, a method of crystallizing an amorphous silicon film through a heat treatment is disclosed in U.S. Pat. No. 5,403,772. According to the method disclosed in this patent, in order to accelerate crystallization at a low temperature, a small amount of metal elements are added to the amorphous silicon film as a catalyst material. Further, there is disclosed that the lowering of a heat treatment temperature and the reduction of a treatment time are enabled. Also, there is disclosed in the publication that a simple substance of nickel (Ni), iron (Fe), cobalt (Co) or platinum (Pt). or a compound of any one of those materials and silicon or the like is suitable for the catalyst material.

However, since any catalyst material used for accelerating crystallization is a material which is naturally undesirable for crystalline silicon it has been desired that the concentration of the catalyst material is as low as possible. The concentration of a catalyst material necessary for accelerating crystallization was $1\times10^{17}/cm^3$ to $1\times10^{20}/cm^3$. However, even when the concentration is relatively low, since the above catalyst material is a heavy metal element, the material contained in silicon forms a defect level, thereby lowering the characteristic of a fabricated element.

By the way, the principle of operation of a solar cell fabricated by forming a p-n junction can be roughly described as follows. The solar cell absorbs light and generates the charges of electrons/holes due to an absorbed light energy. The electrons move toward an n-layer side, and the holes move toward a p-layer side due to the drifts caused by a junction electric field and diffusion. However, when the defect level are high in silicon, the charges are trapped by the defect level while they are moving in the silicon, thereby disappearing. In other words, the photoelectric conversion characteristics are caused to lower. A period of time since the electrons/holes generate until they disappear is called "a life time". In the solar cell, it is desirable that the lifetime is long. Hence it has been necessary to reduce the heavy metal element that generate the defect level in silicon as much as possible.

SUMMARY OF THE INVENTION

The present invention has been made in view of the above circumstances, and therefore an object of the present invention is to provide a method of manufacturing a thin-film solar cell, which keeps the feature of crystallization due to the above catalyst material and removes the catalyst material after the crystallization has been completed.

Another object of the present invention is to provide a solar cell which is excellent in the photoelectric conversion characteristic, using the above method.

In accordance with the primary feature of the present invention, a method of manufacturing a photoelectric conversion device includes a step of forming a gettering layer on a crystallized semiconductor layer obtained by using the catalyst metal such as nickel. The gettering layer may be either insulative or semiconductive and contains phosphorus to absorb the catalyst metal such as nickel from the semiconductor layer after it is crystallized, thereby, reducing the concentration of the catalyst metal in the semiconductor layer. Specifically, the method includes the steps of:

disposing a metal containing layer in contact with an upper or lower surface of a non-single crystalline silicon semiconductor layer;

crystallizing the non-single crystalline silicon semiconductor layer by heating wherein the metal functions to promote the crystallization;

forming a gettering layer on or within said semiconductor layer after crystallized, the gettering layer containing phosphorus; and heating said semiconductor layer and the gettering layer in order to getter the metal contained in the semiconductor layer.

As the metal element, it is possible to use one or more elements of Ni, Fe, Co, Ru, Rh, Pd, Os, Ir, Pt, Cu and Au.

In accordance with a preferred embodiment of the invention the gettering layer may be a silicon layer to which phosphorus is added during the deposition thereof onto the crystallized semiconductor layer. In an alternative, the gettering layer may be a phosphorus doped region formed within the crystallized semiconductor layer, namely, a method of the present invention includes a step of introducing ions of phosphorus into a surface region of the crystallized semiconductor layer by ion doping after crystallizing the semiconductor layer by the use of the catalyst metal. In a further alternative, the gettering layer may be a phosphorus silicate glass (PSG) layer deposited on the crystallized semiconductor layer.

In accordance with another aspect of the invention, the catalyst metal is provided by disposing the metal containing layer in contact with an upper or lower surface of a non-single crystalline semiconductor layer to be crystallized in the case of disposing the metal containing layer under the non-single crystalline semiconductor layer the metal containing layer may be used also as a lower electrode of the photoelectric conversion device.

In accordance with a still another aspect of the invention a solar cell comprises a substrate, a first crystalline silicon film having a substantially intrinsic conductivity type formed on the substrate and a second crystalline silicon film having one conductivity type adjacent to the first crystalline silicon film, wherein the first crystalline silicon film contains a catalyst element for promoting crystallization of silicon at a concentration not higher than $5 \times 10^{18}$ atoms/cm$^3$. The concentration value disclosed in the present invention is determined by a secondary ion mass spectroscopy and corresponds to a maximum value of the measured values.

In accordance with a further aspect of the invention in the above mentioned solar cell, a concentration of the catalyst contained in the second crystalline silicon film is higher than the concentration of the catalyst contained in the first crystalline silicon film.

In accordance with a still further aspect of the invention, the crystalline semiconductor firm obtained by using the catalyst metal such as nickel has a plurality of crystal grains in the form of needles.

According to the present invention the lifetime of carriers in the crystalline silicon film is increased, and the excellent characteristics of the thin-film solar cell are obtained.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Now a description will be given in more detail of embodiments of the present invention with reference to the accompanying drawings.

(First Embodiment)

A first embodiment shows a process of manufacturing a thin-film solar cell which is manufactured through a method of forming an amorphous silicon film in close contact with metal elements that accelerate the crystallization of silicon, crystallizing said amorphous silicon film through a heat treatment, and removing said metal elements remaining in the amorphous silicon film after the crystallization.

Figure 1A:
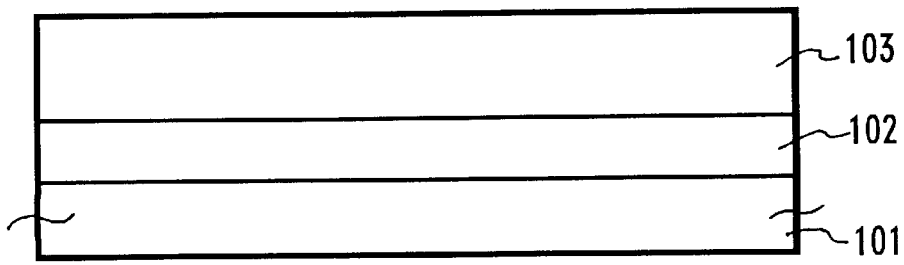
FIGS. 1A to 1D are schematic diagrams showing a method of manufacturing a thin-film solar cell in accordance with the present invention.

This embodiment will be described with reference to Firs. 1A to 1D. In this embodiment, nickel is used as metal elements having a catalyst action that accelerates the crystallization of silicon. First, a silicon oxide film 102 having a thickness of 0.3 μm is formed on a glass substrate (for example, Corning 7059 glass substrate) 101 as an underlying layer. The silicon oxide film 102 is formed through a plasma CVD technique with a raw material of tetra ethoxy silane (TEOS) and also can be formed through a sputtering technique as another method. Subsequently, an amorphous silicon film 103 is formed with a raw material of silane gas through a plasma CVD technique. The formation of the amorphous silicon film 103 may be conducted using a low pressure thermal CVD technique, a sputtering technique or an evaporation method. The above amorphous silicon film 103 may be a substantially-intrinsic amorphous silicon film or may contain boron (B) at 0.001 to 0.1 atms %. Also, the thickness of the amorphous silicon film 103 is set to 10 μm. It is needless to say that the thickness may be set to a required one (FIG. 1A).

Subsequently, the substrate is immersed in an ammonium hydroxide hydrogen peroxide mixture and then held at 70° C. for 5 minutes to thereby form an oxide film (not shown) on the surface of the amorphous silicon film 103. The silicon oxide film is formed in order to improve its wettability in a process of coating nickel acetate solution which will be conducted later. Furthermore, the nickel acetate solution is coated on the surface of the amorphous silicon film 103 by spin coating. The nickel element functions as an element that accelerates the crystallization in crystallizing the amorphous silicon film 103.

Subsequently, the amorphous silicon film 103 is held at a temperature of 450° C. for one hour in a nitrogen atmosphere, thereby eliminating hydrogen from the amorphous silicon film 103. This is because dangling bonds are intentionally produced in the amorphous silicon film, to thereby lower a threshold energy in crystallizing later. Then, the amorphous silicon film 103 is subjected to a heat treatment at 550° C. for 4 to 8 hours in the nitrogen atmosphere, to thereby crystallize the amorphous silicon film 103. A temperature in crystallizing can be set to 550° C. because of the action of nickel elements. Hydrogen of 0.001 atms % to 5 atms % is contained in a crystalline silicon film 104 which has been crystallized. During the above heat treatment, nickel element accelerates the crystallization of the crystalline silicon film it is moving in the silicon film.

Figure 1B:
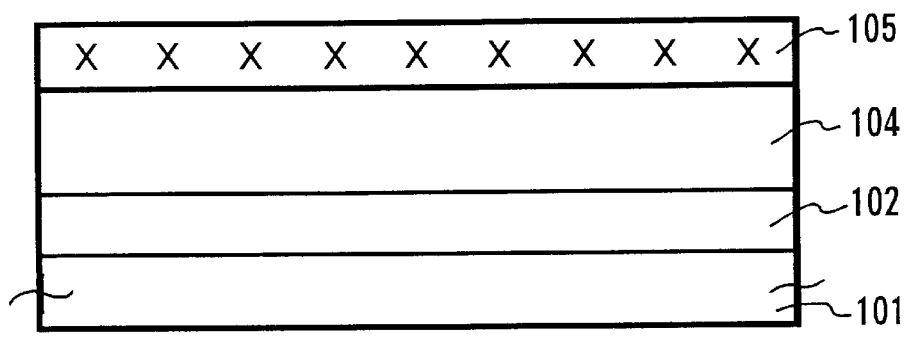

In this way, the crystalline silicon film 104 is formed on the glass substrate. Subsequently, a phosphorus silicate glass (PSG) 105 is formed on the crystalline silicon film 104. The phosphorus silicate glass (PSG) 105 is formed, using a mixture gas consisting of silane, phosphine and oxygen at a temperature of 450° C. through an atmospheric CVD technique. The concentration of phosphorus in the phosphorus silicate glass is set to 1 to 30 wt %, preferably 7 wt %. The phosphorus silicate glass (PSG) 105 is to getter nickel remaining in the crystalline silicon film. Even though the phosphorus silicate glass 105 is merely formed at 450° C., its effect is obtained. More effectively, the phosphorus silicate glass 105 may be subjected to a heat treatment at a heat treatment temperature of 500 to 800° C., preferably 550° C. for 1 to 4 hours in the nitrogen atmosphere. As another method, the phosphorus silicate glass 105 can be replaced by a silicon film to which phosphorus of 0.1 to 10 wt % has been added with the same effect (FIG. 1B).

Figure 1C:
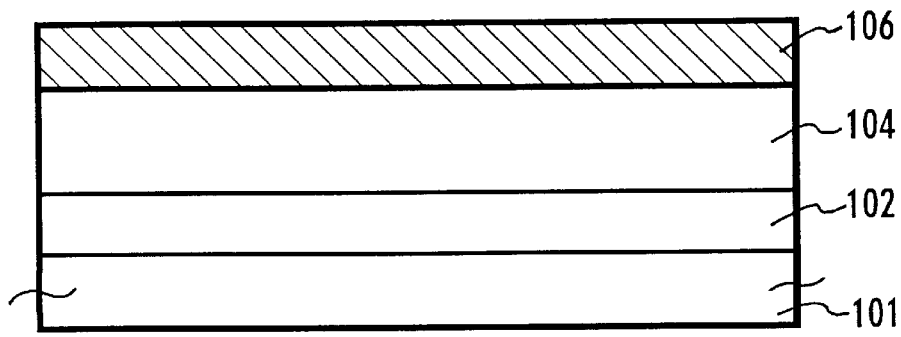

Thereafter, the phosphorus silicate glass 105 is etched using a hydrogen fluoride aqueous solution so as to be removed from the surface of the crystalline silicon film 104. As a result, the surface of the crystalline silicon film 104 is exposed from the main surface of the substrate 101. On that surface is formed an n-type crystalline silicon film 106. The n-type crystalline silicon film 106 may be formed through a plasma CVD technique or through a low % pressure thermal CVD technique. The n-type crystalline silicon film 106 is desirably formed at a thickness of 0.02 to 0.2 μm, and in this embodiment, it is formed at a thickness of 0.1 μm (FIG. 1C).

Figure 1D:
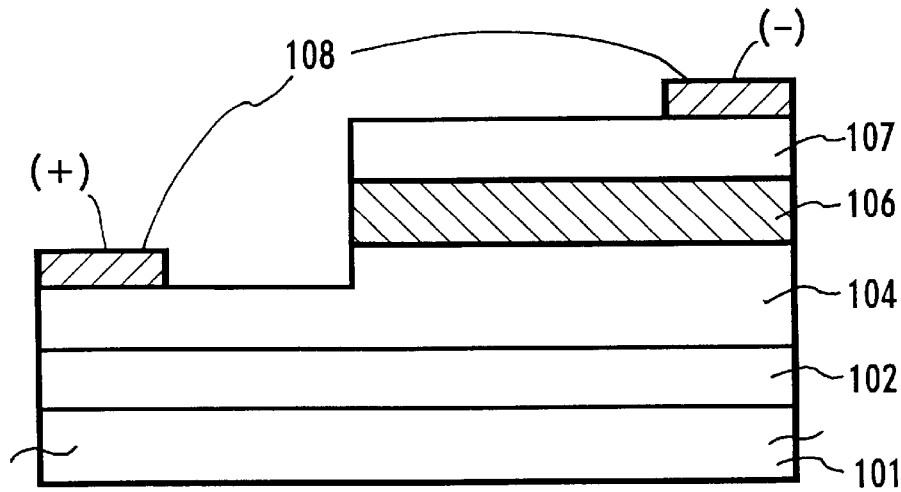

Then a transparent electrode 107 is formed on the above n-type crystalline silicon film 106. The transparent electrode 107 is made of indium tin oxide alloy (ITO) and has a thickness of 0.08 μm through a sputtering technique. Finally, a process of providing lead electrodes 108 is conducted. In providing the lead electrodes 108, as shown in FIG. 1D, a minus side electrode is disposed on the transparent electrode 107, and a plus side electrode is disposed on the crystalline silicon film 104 by removing parts of the transparent electrode 107, the n-type crystalline silicon film 106 and the crystalline silicon film 104. The lead electrodes 108 can be formed by sputtering or vacuum evaporation, or using aluminum, silver, silver paste or the like. Furthermore, after the provision of the lead electrodes 108, the product is subjected to a heat treatment at 150° C. to 300° C. for several minutes with the result that the adhesion between the lead electrodes 108 and the underlying layer becomes high, thereby obtaining an excellent electric characteristic. In this embodiment, the product is subjected to a heat treatment at 200° C. for 30 minutes in a nitrogen atmosphere using an oven.

Through the above-mentioned processes, a thin-film solar cell is completed.

(Second Embodiment)

In a second embodiment, there is shown a thin-film solar cell which formed in the process where a metal element that accelerates the crystallization of crystalline silicon is removed after crystallization through the method where phosphorus is implanted through a plasma doping method into the surface of crystalline silicon film.

Figure 2A:
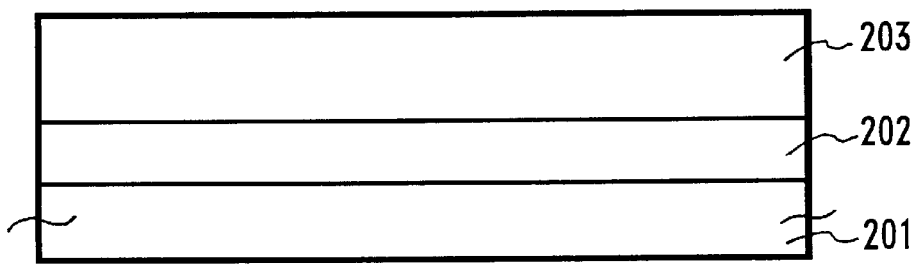
FIGS. 2A to 2D are schematic diagrams showing a method of manufacturing a thin-film solar cell in accordance with the present invention.

A second embodiment will be described with reference to FIGS. 2A to 2D. Nickel is used to accelerate the crystallization of silicon as a metal element working as a catalyst in this embodiment. First, a silicon oxide film 202 having a thickness of 0.3 μm is formed on a glass substrate (for example, Corning 7059 glass substrate) 201 as an underlying layer. The silicon oxide film 202 is formed by plasma CVD with a raw material of tetra ethoxy silane (TEOS), and also can be formed through a sputtering technique as another method. Subsequently, an amorphous silicon film 203 is formed with a raw material of silane gas through a plasma CVD technique. The formation of the amorphous silicon film 203 may be conducted using a low pressure thermal CVD technique, a sputtering technique or an evaporation method. The above amorphous silicon film 203 may be a substantially-intrinsic amorphous silicon film or an amorphous silicon film to which boron (B) of 0.001 to 0.1 atms % has been added. Also, the thickness of the amorphous silicon film 203 is set to 20 μm. It is needless to say that the thickness may be set to a required one (FIG. 2A).

Thereafter, the substrate is immersed in an ammonium hydroxide hydrogen peroxide mixture at 70° C. for 5 minutes, to thereby form an oxide film (not shown) on the surface of the amorphous silicon film 203. The silicon oxide film is formed in order to improve its wettability in a process of coating nickel acetate solution which will be conducted later. Furthermore the nickel acetate solution is coated on the surface of the amorphous silicon film 203 by spin coating. The nickel element functions as an element that accelerates the crystallization in crystallizing the amorphous silicon film 203.

Subsequently, the amorphous silicon film 203 is held at a temperature of 450° C. for one hour in a nitrogen atmosphere, thereby eliminating hydrozen from the amorphous silicon film 203. This is because dangling bonds are intentionally produced in the amorphous silicon film, to thereby lower a threshold energy in crystallizing later. Then, the amorphous silicon film 203 is subjected to a heat treatment at 550° C. for 4 to 8 hours in a nitrogen atmosphere, to thereby crystallize the amorphous silicon film 203. A temperature in crystallizing can be set to 550° C. because of the action of nickel elements. Hydrogen of 0.001 atms % to 5 atms % is contained in a crystalline silicon film 204 which has been crystallized. During the above heat treatment, nickel elements accelerates the crystallization of the crystalline silicon film 204 while it is moving in the silicon film.

Figure 2B:
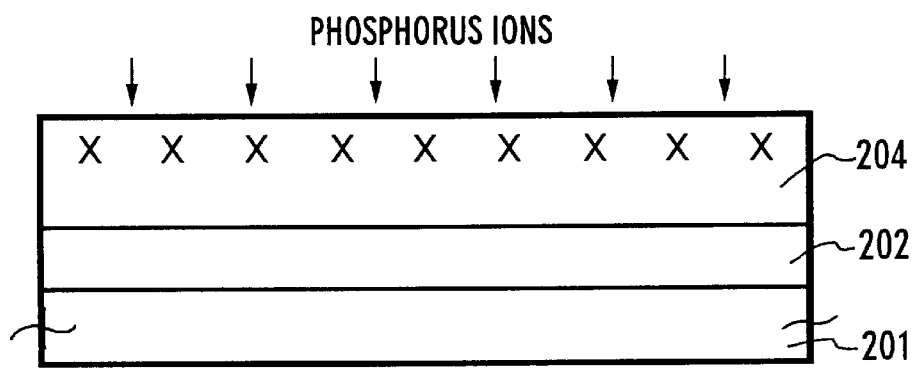

In this way, the crystalline silicon film 204 can be formed on the glass substrate. In this state, the implantation of phosphorus (P) ions is conducted by a plasma doping method. The dose amount may be set to $1 \times 10^{14}$ to $1 \times 10^{17}/cm^2$, and in this embodiment, it is set to $1 \times 10^{16}/cm^2$. An accelerating voltage is set to 20 keV. Through this process, a layer containing phosphorus with a high concentration therein is formed within a region of 0.1 to 0.2 μm depthwise from the surface of the crystalline silicon film 204. Thereafter, a heat treatment is conducted on the crystalline silicon film 204 in order to getter nickel remaining in the crystalline silicon film 204. The crystalline silicon film 204 may be subjected to a heat treatment at 500 to 800° C., preferably 550° C. for 1 to 4 hours in the nitrogen atmosphere (FIG. 2B).

In the crystalline silicon film 204, since a region into which phosphorus ions have been implanted has crystal destroyed, it becomes of a substantially amorphous structure immediately after the ions have been implanted thereinto. Thereafter, since that region is crystallized through said heat treatment, it is usable as the n-type layer of the solar cell even in this state. In this case, the concentration of nickel in the i-type or p-type layer 204 is lower than in the phosphorus doped n-type layer.

Figure 2C:
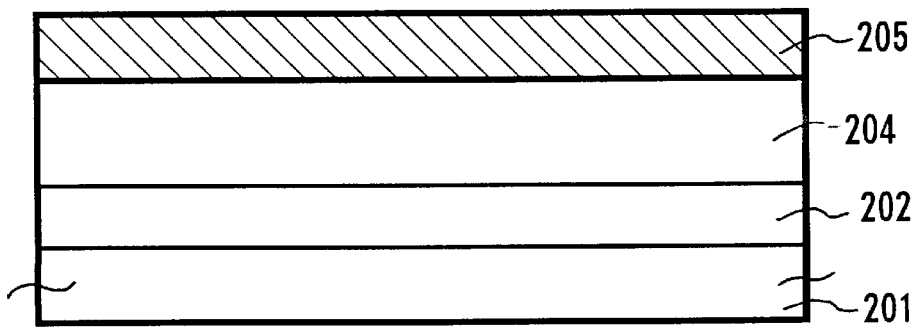

In accordance with the preferred embodiment of the invention. the phosphorus doped region is more desirably removed since nickel that has functioned as a catalyst element is segregated in this region. As the removing method, after a natural oxide film thinly formed on the surface has been etched using a hydrogen fluoride aqueous solution it is removed using sulfur hexafluoride and nitric trifluoride through by dry etching. With this process, the surface of the crystalline silicon film 204 is exposed. On that surface is formed an n-type crystalline silicon film 205. The n-type crystalline silicon film 205 may be formed by plasma CVD or low pressure thermal CVD. The n-type crystalline silicon film 205 is desirably formed at a thickness of 0.02 to 0.2 µm, and in this embodiment, it is formed at a thickness of 0.1 µm (FIG. 2C).

Figure 2D:
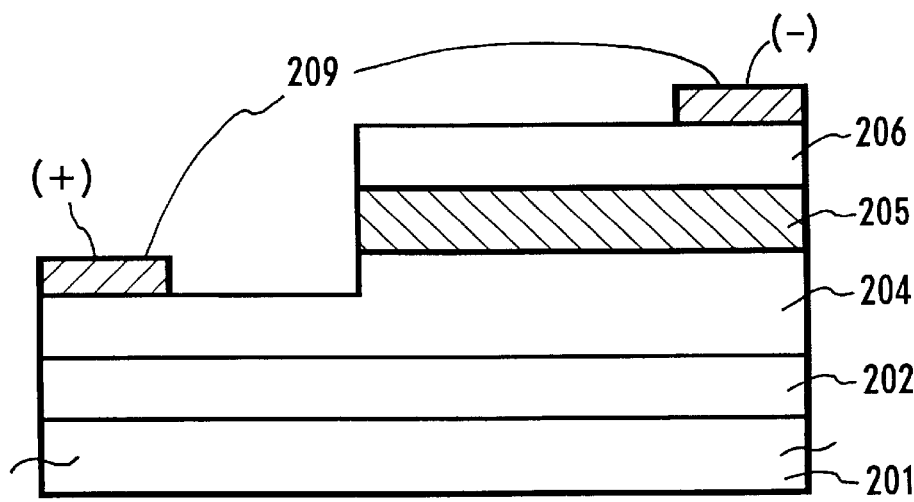

Then, a transparent electrode 206 is formed on the above n-type crystalline silicon film 205. The transparent electrode 206 is made of indium tin oxide alloy (ITO) and has a thickness of 0.08 µm through a sputtering technique. Finally, a process of providing lead electrodes 207 is conducted. In providing the lead electrodes 207, as shown in FIG. 2D, a minus side electrode is disposed on the transparent electrode 206, and a plus side electrode is disposed on the crystalline silicon film 204 by removing parts of the transparent electrode 206, the n-type crystalline silicon film 205 and the crystalline silicon film 204. The lead electrodes 207 can be formed through a sputtering technique or an evaporation method, using aluminum, silver, silver paste or the like. Furthermore, after the provision of the lead electrodes 207, the substrate is subjected to a heat treatment at 150° C. to 300° C. for several minutes with the result that the adhesion between the lead electrodes 207 and the underlying layer becomes high, thereby obtaining an excellent electric characteristic. In this embodiment, the substrate is subjected to a heat treatment at 200° C. for 30 minutes in a nitrogen atmosphere using an oven.

Through the above-mentioned processes, a thin-film solar cell is completed.

(Third Embodiment)

Figure 3:
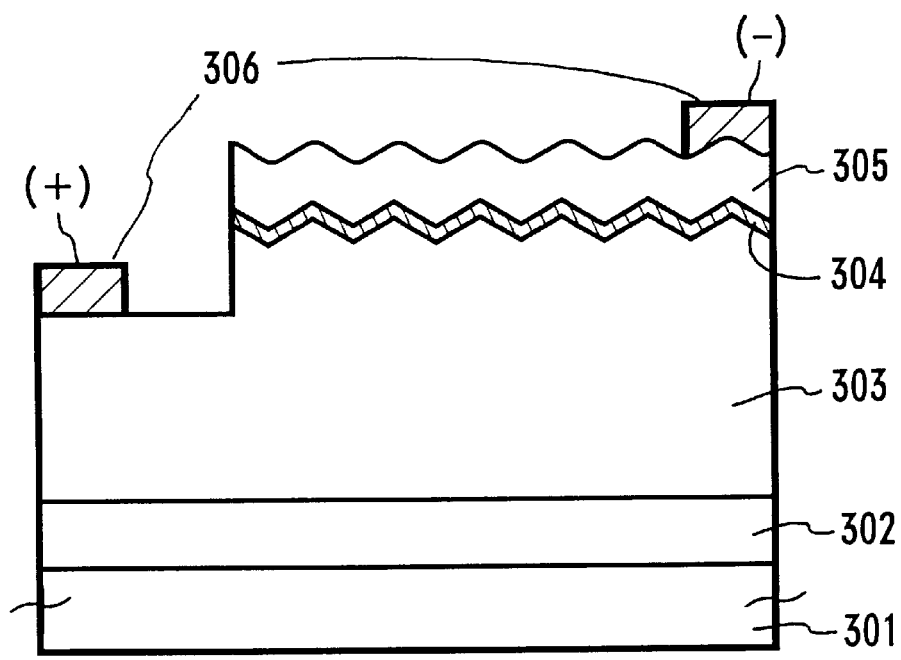
FIG. 3 is a diagram shoving one example of a cross-sectional structure of a thin-film solar cell in accordance with the present invention.

A third embodiment shows an example where in the process of manufacturing the thin-film solar cell described with reference to the first and second embodiments, the surface of the crystalline silicon film is subjected to an anisotropic etching process so as to make the surface of the solar cell irregular as shown in FIG. 3. A technique by which that surface is made irregular so that the reflection from the surface of the solar cell is reduced is called "a texture technique".

A silicon oxide film 302 having a thickness of 0.3 µm is formed on a glass substrate (for example, Corning 7059 glass substrate) 301 as an underlying layer. The silicon oxide film 302 is formed by plasma CVD with a raw material of tetra ethoxy silane (TEOS), and also can be formed by sputtering as another method. Subsequently, an amorphous silicon film is formed by plasma CVD. The formation of the amorphous silicon film may be conducted by low pressure thermal CVD, sputtering, evaporation or the like. The above amorphous silicon film 303 may be a substantially-intrinsic amorphous silicon film or an amorphous silicon film to which boron (B) of 0.001 to 0.1 atms % has been added. Also the thickness of the amorphous silicon film is set to 20 µm. It is needless to say that the thickness may be set to a required one.

Subsequently, the substrate is immersed in an ammonium hydroxide and hydrogen peroxide mixture and then held at 70° C. for 5 minutes, to thereby form an oxide film on the surface of the amorphous silicon film. The silicon film is formed in order to improve its wettability in a process of coating nickel acetate solution which will be conducted later. Furthermore, the nickel acetate solution is coated on the surface of the amorphous silicon film by spin coating. The nickel element functions as an element that accelerates the crystallization in crystallizing the amorphous silicon film.

Subsequently, the amorphous silicon film is held at a temperature of 450° C. for one hour in a nitrogen atmosphere, thereby eliminating hydrogen from the amorphous silicon film. This is because unpaired couplings are intentionally produced in the amorphous silicon film, to thereby lower a threshold energy in crystallizing later. Then, the amorphous silicon film is subjected to a heat treatment at 550° C. for 4 to 8 hours in the nitrogen atmosphere, to thereby crystallize the amorphous silicon film to obtain a crystalline silicon film 303. A temperature in crystallizing can be set to 550° C. because of the action of nickel elements. Hydrogen of 0.001 atms % to 5 atms % is contained in the crystalline silicon film 303 which has been crystallized. During the above heat treatment, nickel elements accelerates the crystallization of the crystalline silicon film 303 while it is moving in the silicon film In this way, the crystalline silicon film 303 can be formed on the glass substrate. Then, a gettering process is conducted on the crystalline silicon film 304 in order to remove nickel remaining in the crystalline silicon film 304. A method of conducting the gettering process may be a method of forming a phosphorus silicate glass (PSG) on the crystalline silicon film 303, or a method of implanting phosphorus ions into the surface of the crystalline silicon film 303.

In a method of forming the phosphorus silicate glass (PSG), the phosphorus silicate glass film is formed, using a mixture gas consisting of silane, phosphine and oxygen, at a temperature of 450° C. through atmospheric CVD. The gettering process is conducted by subjecting the crystalline silicon film to a heat treatment at 550° C. for 1 to 4 hours in a nitrogen atmosphere. Thereafter, the phosphorus silicate glass film is desirably etched using a hydrogen fluoride aqueous solution so as to be removed.

In the method of implanting phosphorus ions into the surface of the crystalline silicon film, the implantation of ions can be conducted through plasma doping. The dose amount may be set to $1 \times 10^{14}$ to $1 \times 10^{17}$/cm$^2$, and in this embodiment, it is set to $1 \times 10^{16}$/cm$^2$. An accelerating voltage is set to 20 keV. Through this process, a layer containing phosphorus with a high concentration therein is formed within a region of 0.1 to 0.2 µm depthwise from the surface of the crystalline silicon film. Thereafter, a heat treatment is conducted on the crystalline silicon film in order to getter nickel remaining in the crystalline silicon film. The heat treatment is conducted at a temperature of 500 to 800° C., preferably 550° C. for 1 to 4 hours in the nitrogen atmosphere.

After the gettering process has been completed, the texture process is conducted on the surface of the crystalline silicon film. The texture process can be conducted using hydrazine or sodium hydroxide aqueous solution. Hereinafter, a case of using sodium hydroxide will be described.

The texture process is conducted by heating an aqueous solution containing sodium hydroxide 2% in concentration to 80° C. Under this condition, the etching, rate of the crystalline silicon film thus obtained in this embodiment is about 1 µm/min. The etching is conducted for five minutes, and thereafter the crystalline silicon film is immersed in boiling water in order to immediately cease the reaction and sufficiently cleaned by flowing water. As a result of observing the surface of the crystalline silicon film which has been subjected to the texture process through an electron microscope, the unevenness of about 0.1 to 5 μm is found on the surface although it is at random.

On that surface is formed an n-type crystalline silicon film 304. The n-type crystalline silicon film 304 may be formed through a plasma CVD technique or through a low pressure thermal CVD technique. The n-type crystalline silicon film 304 is desirably formed at a thickness of 0.02 to 0.2 μm, and in this embodiment, it is formed at a thicknes of 0.1 μm.

Then, a transparent electrode 305 is formed on the above n-type crystalline silicon film 304. The transparent electrode 305 is made of indium tin oxide alloy (ITO) and has a thickness of 0.08 μm by sputtering. Finally, a process of providing lead electrodes 307 is conducted. In providing the lead electrodes 307, as shown by the structure in FIG. 3D, a minus side electrode is disposed on the transparent electrode 305, and a plus side electrode is disposed on the crystalline silicon film 303 by removing parts of the transparent electrode 305, the n-type crystalline silicon film 304 and the crystalline silicon film 303. The lead electrodes 306 can be formed by sputtering or vacuum evaporation, or using aluminum, silver, silver paste or the like. Furthermore, after the provision of the lead electrodes 307, the entire structure is subjected to a heat treatment at 150° C. to 300° C. for several minutes with the result that the adhesion between the lead electrodes 207 and the underlying layer becomes high, thereby obtaining an excellent electric characteristic. In this embodiment, the heat treatment was conducted at 200° C. for 30 minutes in a nitrogen atmosphere using an oven.

Through the above-mentioned processes a thin-film solar cell having the texture structure on the surface is completed.

(Fourth Embodiment)

Figure 4:
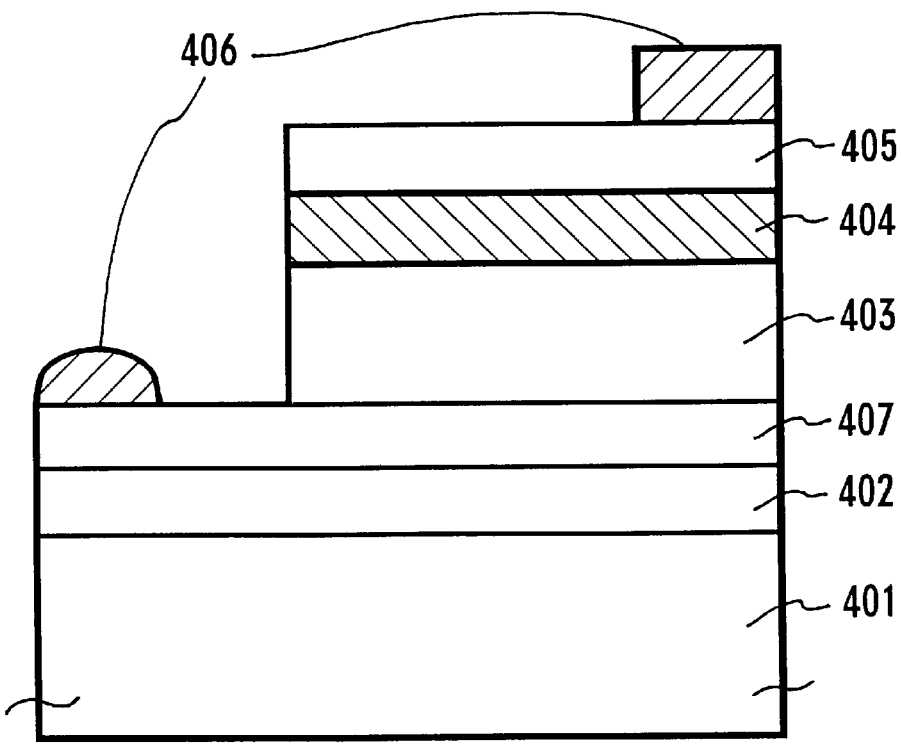
FIG. 4 is a diagram showing one example of a cross-sectional structure of a thin-film solar cell in accordance with the present invention.

A fourth embodiment shows a process of manufacturing a thin-film solar cell, as shown in FIG. 4, in which a coating of metal elements that accelerate the crystallization of silicon is formed on a substrate an amorphous silicon film is formed on the coating of metal elements and the amorphous silicon film is crystallized through a heat treatment and after crystallization, the metal elements diffused in the silicon film are removed therefrom.

First, a coating of the metal element that accelerates the crystallization of silicon is formed on a substrate. Nickel is used as the metal element. A silicon oxide film having a thickness of 0.3 μm is first formed on a glass substrate (for example, Corning 7059 glass substrate) 401 as an underlying layer 402. The silicon oxide film is formed through a plasma CVD technique with a raw material of tetra ethoxy silane (TEOS), and also can be formed through a sputtering technique as another method. Subsequently, a nickel film 407 is formed on the substrate. The nickel film 407 having 0.1 μm is formed using a tablet made of pure nickel through an electron beam evaporation method. Then, an amorphous silicon film is formed through a plasma CVD technique. The formation of the amorphous silicon film may be conducted through low pressure thermal CVD, sputtering, evaporation or the like. The above amorphous silicon film may be a substantially-intrinsic amorphous silicon film or an amorphous silicon film to which boron (B) of 0.001 to 0.1 atms % has been added. Also, the thickness of the amorphous silicon film is set to 10 μm. It is needless to say that the thickness may be set to a required one.

Subsequently, the amorphous silicon film is held at a temperature of 450° C. for one hour in a nitrogen atmosphere, thereby eliminating hydrogen from the amorphous silicon film. This is because dangling bonds are intentionally produced in the amorphous silicon film, to thereby lower a threshold energy in crystallizing later. Then the amorphous silicon film is subjected to a heat treatment at 550° C. for 4 to 8 hours in the nitrogen atmosphere, to thereby crystallize the amorphous silicon film to obtain a crystalline silicon film 403. A temperature in crystallizing can be set to 550° C. because of the action of nickel elements. Hydrogen of 0.001 atms % to 5 atms % is contained in a crystalline silicon film 403 which has been crystallized. During the above heat treatment, a small amount of nickel elements diffuse from the nickel film disposed under the amorphous silicon film into the silicon film, and accelerates the crystallization of the crystalline silicon film 403 while it is moving in the silicon film.

In this way, the crystalline silicon film 403 is formed on the glass substrate. Subsequently, a phosphorus silicate glass (PSG) is formed on the crystalline silicon film 403. The phosphorus silicate glass (PSG) is formed using a mixture gas consisting of silane, phosphine and oxygen at a temperature of 450° C. by atmospheric CVD. The concentration of phosphorus in the phosphorus silicate glass is set to 1 to 3 wt % preferably 7 wt %. The phosphorus silicate glass is to getter nickel remaining in the crystalline silicon film. Even though the phosphorus silicate glass is merely formed at 450° C. its effect is obtained. More effectively, the phosphorus silicate glass may be subjected to a heat treatment at a temperature of 500 to 800° C., preferably 550° C. for 1 to 4 hours in the nitrogen atmosphere. As another method, the phosphorus silicate glass can be replaced by a silicon film to which phosphorus of 0.1 to 10 wt % has been added with the same effect.

Thereafter, the phosphorus silicate glass is etched using a hydrogen fluoride aqueous solution so as to be removed from the surface of the crystalline silicon film. As a result, the surface of the crystalline silicon film 403 is exposed from the main surface of the substrate. On that surface is formed an n-type crystalline silicon film 404. The n-type crystalline silicon film 404 may be formed by plasma CVD or low pressure thermal CVD. The n-type crystalline silicon film 404 is desirably formed at a thickness of 0.02 to 0.2 μm, and in this embodiment, it is formed at a thickness of 0.1 μm.

Then, a transparent electrode 405 is formed on the above n-type crystalline silicon film 404. The transparent electrode 405 is made of indium tin oxide alloy (ITO) and has a thickness of 0.08 μm by sputtering. Finally, a process of providing lead electrodes 406 is conducted. In providing the lead electrodes as shown in FIG. 4. a minus side electrode is disposed on the transparent electrode 405, and a plus side electrode is disposed on the crystalline silicon film 403 by removing parts of the transparent electrode 405 the n-type crystalline silicon film 404 and the crystalline silicon film 403. The lead electrodes 406 can be formed by sputtering or vacuum evaporation, or using aluminum silver silver paste or the like. Furthermore, after the provision of the lead electrodes, the substrate is subjected to a heat treatment at 150° C. to 300° C. for example at 200° C. for 30 minutes in a nitrogen atmosphere with the result that the adhesion between the lead electrodes and the underlying layer becomes high, thereby obtaining an excellent electric characteristic.

Through the above-mentioned processes, a thin-film solar cell is completed.

As was described above, in the method of manufacturing the thin-film solar cell in accordance with the present invention, in a process of crystallizing an amorphous silicon film by a heat treatment, a catalyst material such as nickel is used, thereby making it possible to obtain a crystalline silicon film at a heat treatment temperature lower than the conventional method. Furthermore, the method of the present invention enables the concentration of the catalyst material remaining in the crystalline silicon film obtained to be lowered. As a result, a thin-film solar cell that uses an inexpensive glass substrate and is excellent in photoelectric conversion characteristic can be obtained.

The foregoing description of a preferred embodiment or the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device comprising:
    providing a semiconductor film on an insulating surface, said semiconductor film including at least a part having a catalyst material;
    crystallizing said semiconductor film in a way such that said catalyst diffuses through the semiconductor film and functions to promote crystallization of said semiconductor film;
    introducing phosphorous into at least a portion of said semiconductor film after the crystallization; and
    thermally annealing said semiconductor film at a temperature not lower than 500° C. to activate said phosphorus in order to getter the catalyst in said semiconductor film.

2. A method according to claim 1 wherein said catalyst material comprises a metal.

3. A method according to claim 1 wherein said semiconductor device is a photoelectric conversion device.

4. A method according to claim 1 wherein said thermally annealing is continued for 1–4 hours.

5. A method according to claim 1 wherein said introducing phosphorous comprises accelerating ions of phosphorus.

6. A method according to claim 1 wherein said introducing phosphorous comprises introducing said phosphorous at a dose of between $1\times10^{14}$ and $1\times10^{17}/cm^2$.

7. A method according to claim 1 wherein said thermal annealing is conducted at a temperature not higher than 800° C.

8. A method according to claim 1 wherein said catalyst material is a metal selected from the group consisting of Ni, Fe, Co, Ru, Rh, Pd, Os, Ir, Pt, Cu, and Au.

9. A method according to claim 1 further comprising removing said portion of the semiconductor film after the thermally annealing.

10. A method of manufacturing a semiconductor device comprising:
    providing a substantially intrinsic semiconductor film on an insulating surface, said semiconductor film including at least a part having a catalyst containing material, said semiconductor film comprising silicon doped with boron at a concentration of 0.001–0.1 atm %;
    crystallizing said semiconductor film wherein said catalyst diffuses through the semiconductor film and functions to promote crystallization thereof;
    introducing phosphorous into at least a portion of said semiconductor film after the crystallization; and
    thermally annealing said semiconductor film to activate said phosphorous in order to getter the catalyst contained in said semiconductor film.

11. A method according to claim 10 wherein said catalyst material comprises a metal.

12. A method according to claim 10 wherein said semiconductor device is a photoelectric conversion device.

13. A method according to claim 10 wherein said thermally annealing is continued for 1–4 hours.

14. A method according to claim 10 wherein said introducing phosphorous comprises accelerating ions of phosphorus.

15. A method according to claim 10 wherein said introducing phosphorous comprises introducing said phosphorous at a dose of $1\times10^{14}$ to $1\times10^{17}/cm^2$.

16. A method according to claim 10 wherein said catalyst is a metal selected from the group consisting of Ni, Fe, Co, Ru, Rh, Pd, Os, Ir, Pt, Cu, and Au.

17. A method according to claim 10 further comprising removing said portion of the semiconductor film after the thermally annealing.

18. A method according to claim 10 wherein said thermally annealing is conducted at a temperature from 500° C. to 800° C.

19. A method of manufacturing a semiconductor device comprising:
    providing a semiconductor film on an insulating surface, said semiconductor film including at least a part having a catalyst containing material;
    diffusing said catalyst metal through the semiconductor film and crystallizing said semiconductor film using the diffused catalyst to promote crystallization of said semiconductor film;
    introducing phosphorous into a portion of said semiconductor film after the crystallization; and
    thermally annealing said semiconductor film in a nitrogen atmosphere to activate said phosphorous in order to getter the catalyst contained in said semiconductor film.

20. A method according to claim 19 wherein said catalyst material comprises a metal.

21. A method according to claim 19 wherein said semiconductor device is a photoelectric conversion device.

22. A method according to claim 19 wherein said thermal annealing is continued for 1–4 hours.

23. A method according to claim 19 wherein said introducing phosphorous comprises accelerating ions of phosphorous.

24. A method according to claim 19 wherein said introducing phosphorous comprises introducing said phosphorous at a dose of $1\times10^{14}$ to $1\times10^{17}/cm^2$.

25. A method according to claim 19 wherein said semiconductor film comprises silicon.

26. A method according to claim 19 wherein said catalyst is a metal selected from the group consisting of Ni, Fe, Co, Ru, Rh, Pd, Os, Ir, Pt, Cu, and Au.

27. A method according to claim 19 further comprising a step of removing said portion of the semiconductor film after the gettering.

28. A method according to claim 19 wherein said thermal annealing is conducted within a temperature from 500° C. to 800° C.

29. A method of manufacturing a semiconductor device having a junction between at least two different type semiconductor materials, said method comprising:

providing a semiconductor film comprising amorphous silicon formed on an insulating surface, said semiconductor film including at least a part having a catalyst containing material;

crystallizing said semiconductor film by heating in a way such that said catalyst diffuses through the semiconductor film and functions to promote crystallization of said semiconductor film;

introducing ions of a gettering material into a portion of said semiconductor film after the crystallization; and thermally annealing said semiconductor film at a temperature not lower than 500° C. to activate said gettering material in order to getter the catalyst material contained in said semiconductor film, wherein said semiconductor film constitutes said junction between said different type semiconductor materials.

30. A method according to claim 29 wherein said catalyst material comprises a metal.

31. A method according to claim 29 wherein said semiconductor device is a photoelectric conversion device.

32. A method according to claim 29 wherein said thermally annealing is continued for 1–4 hours.

33. A method according to claim 29 wherein said gettering material is phosphorous.

34. A method according to claim 29 wherein said ions are introduced at a dose of $1 \times 10^{14}$ to $1 \times 10^{17}$ cm$^2$.

35. A method according to claim 29 wherein said thermally annealing is conducted at a temperature not higher than 800° C.

36. A method according to claim 29 wherein said catalyst is a metal selected from the group consisting of Ni, Fe, Co, Ru, Rh, Pd, Os, Ir, Pt, Cu, and Au.

37. A method according to claim 29 further comprising removing said portion of the semiconductor film after the thermally annealing.

38. A method of manufacturing a semiconductor device having a junction between at least two different type semiconductor materials, said method comprising:

providing a substantially intrinsic semiconductor film on an insulating surface, said semiconductor film including at least a part having a catalyst containing material, said semiconductor film comprising amorphous silicon doped with boron at a concentration of 0.001–0.1 atm %;

crystallizing said semiconductor film by heating in a way such that said catalyst diffuses through the semiconductor film and functions to promote crystallization of said semiconductor film;

introducing ions of a gettering material into a portion of said semiconductor film after the crystallization; and thermally annealing said semiconductor film to activate said gettering material in order to getter the catalyst containing material in said semiconductor film, wherein said semiconductor film constitutes said junction of said different type semiconductor materials.

39. A method according to claim 38 wherein said catalyst material comprises a metal.

40. A method according to claim 38 wherein said semiconductor device is a photoelectric conversion device.

41. A method according to claim 38 wherein said thermally annealing is continued for 1–4 hours.

42. A method according to claim 38 wherein said gettering material is phosphorous.

43. A method according to claim 38 wherein said ions are introduced at a dose of $1 \times 10^{14}$ to $1 \times 10^{17}$ cm$^{-2}$.

44. A method according to claim 38 wherein said catalyst is a metal selected from the group consisting of Ni, Fe, Co, Ru, Rh, Pd, Os, Ir, Pt, Cu, and Au.

45. A method according to claim 38 further comprising a step of removing said portion of the semiconductor film after the gettering.

46. A method according to claim 38 wherein said thermally annealing is conducted within a temperature from 500° C. to 800° C.

47. A method of manufacturing a semiconductor device having a junction between at least two different type semiconductor materials, said method comprising:

providing a semiconductor film comprising amorphous silicon on an insulating surface, said semiconductor film including at least a part having a catalyst containing material;

crystallizing said semiconductor film by heating in a way such that said catalyst diffuses through the semiconductor film and functions to promote crystallization of said semiconductor film;

introducing ions of a gettering material into a portion of said semiconductor film after the crystallization; and thermally annealing said semiconductor film in a nitrogen atmosphere to activate said gettering material in order to getter the catalyst in said semiconductor film, wherein said semiconductor film constitutes said junction comprising said different type semiconductor materials.

48. A method according to claim 47 wherein said catalyst material comprises a metal.

49. A method according to claim 47 wherein said semiconductor device is a photoelectric conversion device.

50. A method according to claim 47 wherein said thermal annealing is continued for 1–4 hours.

51. A method according to claim 47 wherein said gettering material is phosphorous.

52. A method according to claim 47 wherein said introducing ions comprises introducing ions at a dose of $1 \times 10^{14}$ to $1 \times 10^{17}$ cm$^{-2}$.

53. A method according to claim 47 wherein said semiconductor film comprises silicon.

54. A method according to claim 47 wherein said catalyst is a metal selected from the group consisting of Ni, Fe, Co, Ru, Rh, Pd, Os, Ir, Pt, Cu, and Au.

55. A method according to claim 47 further comprising removing a portion of said semiconductor film after the thermally annealing.

56. A method according to claim 47 wherein said thermally annealing is conducted within a temperature from 500° C. to 800° C.

57. A method of manufacturing a semiconductor device comprising:

providing a semiconductor film on an insulating surface, said semiconductor film including at least a part having a catalyst containing material;

crystallizing said semiconductor film in a way such that said catalyst diffuses through the semiconductor film and functions to promote crystallization of said semiconductor film;

introducing phosphorous into at least a portion of said semiconductor film after the crystallization; and thermally annealing said semiconductor film at a temperature not lower than 500° C. to activate said phosphorus in order to react with the catalyst in said semiconductor film.

58. A method according to claim 57 wherein said catalyst material comprises a metal.

59. A method according to claim 57 wherein said catalyst is a metal selected from the group consisting of Ni, Fe, Co, Ru, Rh, Pd, Os, Ir, Pt, Cu, and Au.

60. A method of manufacturing a semiconductor device comprising:

provided a semiconductor film on an insulating surface, said semiconductor film including at least an amorphous material, and at least a part of said semiconductor film having a catalyst containing material;

crystallizing said semiconductor film using said catalyst to diffuse through the semiconductor film and to promote crystallization of said semiconductor film;

introducing a gettering material into at least a portion of said semiconductor film after the crystallization; and thermally annealing said semiconductor film at a temperature not lower than 500° C. to activate said gettering material in order to react with the catalyst in said semiconductor film in a way that reduces a chemical feature of said catalyst metal in said semiconductor film.

61. A method according to claim 60 wherein said catalyst material comprises a metal.

62. A method as in claim 60, wherein said catalyst is a metal which includes nickel and said gettering material is phosphorous.

* * * * *